(12) United States Patent
Chen et al.

(10) Patent No.: US 12,200,865 B2
(45) Date of Patent: Jan. 14, 2025

(54) CIRCUIT BOARD WITH POLYMER CONDUCTIVE MEMBERS

(71) Applicant: BIZLINK INTERNATIONAL CORP., New Taipei (TW)

(72) Inventors: Shi-Jung Chen, New Taipei (TW); Jui-Hung Chien, New Taipei (TW); Yen-Chun Chen, New Taipei (TW)

(73) Assignee: BIZLINK INTERNATIONAL CORP., New Taipei (TW)

( * ) Notice: Subject to any disclaimer, the term of this patent is extended or adjusted under 35 U.S.C. 154(b) by 220 days.

(21) Appl. No.: 18/059,449

(22) Filed: Nov. 29, 2022

(65) Prior Publication Data

US 2023/0171891 A1 Jun. 1, 2023

(30) Foreign Application Priority Data

Nov. 29, 2021 (TW) ................................. 110144482

(51) Int. Cl.
*H05K 1/09* (2006.01)
*H05K 1/02* (2006.01)
*H05K 1/11* (2006.01)

(52) U.S. Cl.
CPC ........... *H05K 1/115* (2013.01); *H05K 1/0218* (2013.01); *H05K 1/09* (2013.01); *H05K 2201/0329* (2013.01)

(58) Field of Classification Search
CPC ........ H05K 1/112; H05K 1/114; H05K 1/092; H05K 1/097
USPC .................................................. 174/262, 265
See application file for complete search history.

(56) References Cited

U.S. PATENT DOCUMENTS

| 5,300,735 | A | * | 4/1994 | Yokono | ................ | H05K 3/4647 |
| | | | | | | 174/250 |
| 8,022,308 | B2 | | 9/2011 | Hu et al. | | |
| 9,972,589 | B1 | | 5/2018 | Goh et al. | | |
| 2008/0244902 | A1 | * | 10/2008 | Blackwell | .............. | H05K 1/186 |
| | | | | | | 29/830 |
| 2010/0052993 | A1 | * | 3/2010 | Kim | ...................... | H01P 11/003 |
| | | | | | | 343/700 MS |
| 2012/0228006 | A1 | | 9/2012 | Chen | | |
| 2016/0037653 | A1 | * | 2/2016 | Kang | ..................... | H05K 3/429 |
| | | | | | | 174/262 |
| 2019/0276688 | A1 | * | 9/2019 | Seol | ....................... | C09D 11/03 |

FOREIGN PATENT DOCUMENTS

| CN | 101160017 B | 3/2012 |
| CN | 106973483 B | 3/2019 |

* cited by examiner

*Primary Examiner* — Timothy J Thompson
*Assistant Examiner* — Michael F McAllister
(74) *Attorney, Agent, or Firm* — CKC & Partners Co., LLC

(57) ABSTRACT

A circuit board includes an insulating substrate layer, a ground layer, an insulating layer, insulating through holes, a signal transmission layer and a polymer conductive member. The ground layer is disposed between the insulating layer and the insulating substrate layer. The signal transmission layer is disposed on one side of the insulating layer opposite to the ground layer. The insulating through holes penetrate through the signal transmission layer and the insulation layer to connect to the ground layer. The polymer conductive member is disposed within the insulating through holes, and one part thereof is electrically connected to the ground layer, and another part thereof extends outwards from the signal transmission layer.

20 Claims, 11 Drawing Sheets

CIRCUIT BOARD WITH POLYMER CONDUCTIVE MEMBERS

RELATED APPLICATIONS

This application claims priority to Taiwan Application Serial Number 110144482, filed on Nov. 29, 2021, which is herein incorporated by reference in its entirety.

BACKGROUND

Field of Disclosure

The present disclosure relates to a circuit board. More particularly, the present disclosure relates to a circuit board having a polymer conductive member.

Description of Related Art

In general, a through hole will be formed on the circuit board by a manufacturing personnel in a manufacturing process of a circuit board, so that a subsequent electroplating process is performed on the through hole of the circuit board, thereby forming a conductive hole (i.e., VIA) on the circuit board. In addition, a metal pillar is soldered to a pad of the circuit board by the manufacturing personnel so as to enhance the block to noise of the circuit board.

However, the above-mentioned process is not only complicated, but also increases the operation time, and also consumes the manufacturing cost and the material cost.

Therefore, the above-mentioned technologies obviously still have inconveniences and defects, which are problems to be solved urgently in the industry.

SUMMARY

One aspect of the present disclosure is to provide a circuit board for solving the difficulties mentioned above in the prior art.

In one embodiment of the present disclosure, a circuit board is provided, and the circuit board includes a first insulating layer, an insulating substrate layer, a first ground layer, a first signal transmission layer, a plurality of insulating through holes and a plurality of polymer conductive members. The first ground layer is disposed between the first insulating layer and the insulating substrate layer, and the first ground layer includes at least one first film-liked metal ground layer. The first signal transmission layer is disposed on one side of the first insulating layer opposite to the insulating substrate layer, and the first signal transmission layer includes a plurality of first film-liked metal signal layers. Each of the insulating through holes penetrates through the first signal transmission layer and the first insulation layer to connect to the first ground layer. The polymer conductive members are respectively disposed within the insulating through holes. A first portion of each of the polymer conductive members is electrically connected to the first film-liked metal ground layer, and a second portion of each of the polymer conductive members protrudes outwards from a surface of the first signal transmission layer.

In one embodiment of the present disclosure, a circuit board is provided, and the circuit board includes a first insulating layer, an insulating substrate layer, a first ground layer, a first signal transmission layer, a plurality of insulating through holes and a plurality of polymer conductive members. The first ground layer is disposed between the first insulating layer and the insulating substrate layer, and the first ground layer includes at least one first film-liked metal ground layer. The first signal transmission layer is disposed on one side of the first insulating layer opposite to the insulating substrate layer, and the first signal transmission layer includes a plurality of first film-liked metal signal layers. Each of the insulating through holes penetrates through the first signal transmission layer and the first insulation layer to connect to the first ground layer. The polymer conductive members are respectively disposed within the insulating through holes. Each of the polymer conductive members includes a first portion and a second portion which are perpendicularly connected to each other. The first portion transversely extends in the first insulating layer, and is electrically connected to the first film-liked metal ground layer, and the second portion extends longitudinally through the first insulating layer and the first signal transmission layer.

Thus, through the construction of the embodiments above, the conductive hole (i.e., VIA) process of the conventional circuit board is replaced by filling the polymer conductive members into the circuit board and conducting the ground layer in the circuit board. In this way, not only the manufacturing process is simplified, the operation time is shortened, but also the manufacturing cost and material cost are saved.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
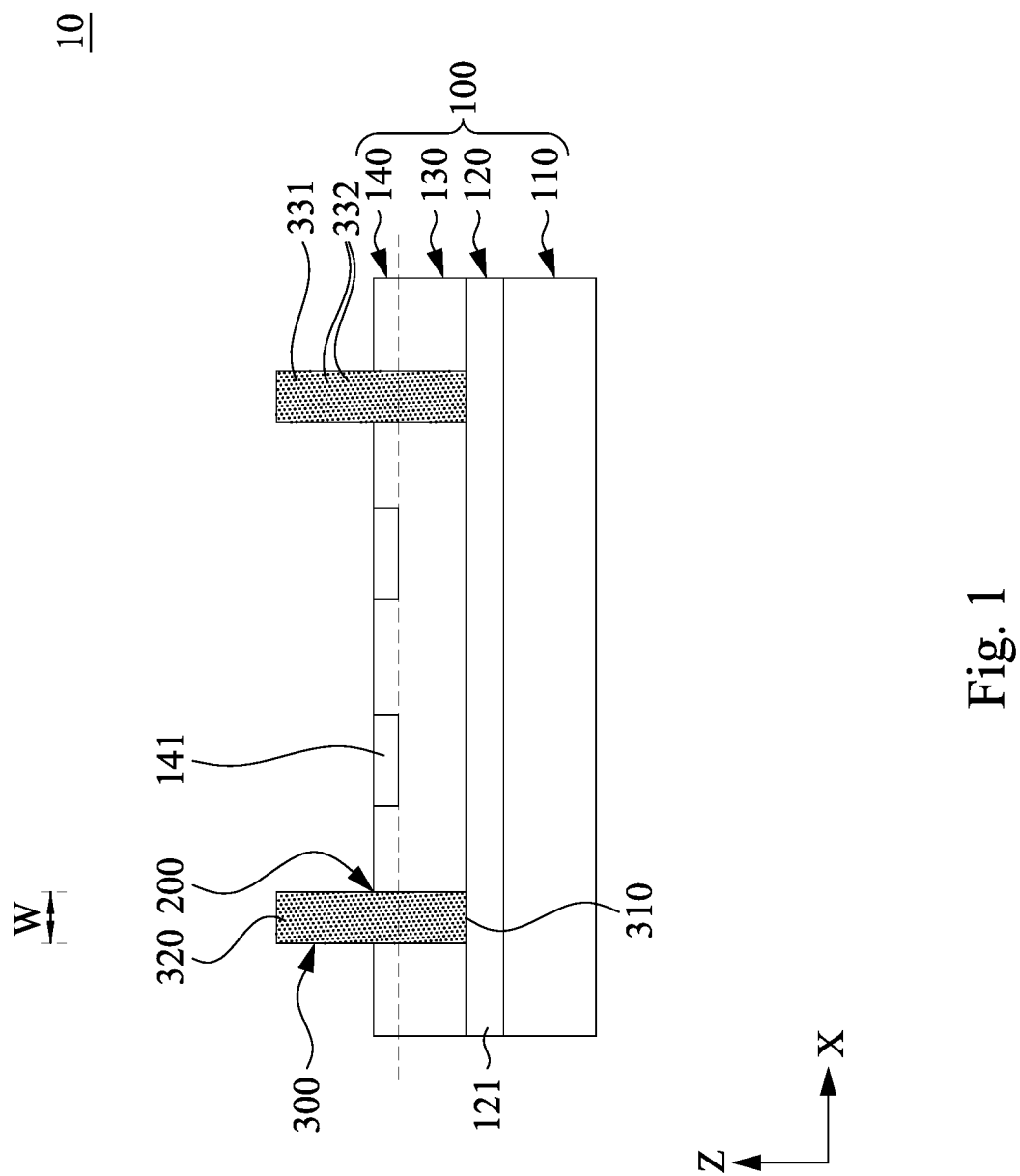
FIG. 1 is a schematic view of a circuit board according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Reference is now made to FIG. 1, in which FIG. 1 is a schematic view of a circuit board 10 according to one embodiment of the present disclosure. As shown in FIG. 1, in this embodiment, the circuit board 10 includes a stacked structure 100, a plurality of insulating through holes 200 and a plurality of polymer conductive members 300. The stacked structure 100 includes an insulating substrate layer 110, a first ground layer 120, a first insulating layer 130 and a first signal transmission layer 140, which are stacked in sequence. In other words, the first ground layer 120 is located between the insulating substrate layer 110 and the first insulating layer 130, and the first signal transmission layer 140 is located on one side of the first insulating layer 130 opposite to the insulating substrate layer 110. More specifically, the first ground layer 120 is directly interposed between the between the insulating substrate layer 110 and the first insulating layer 130, and the first signal transmission layer 140 is directly located on one side of the first insulating layer 130 opposite to the insulating substrate layer 110. However, the disclosure is not limited thereto.

In the embodiment, each of the insulating through holes 200, for example, an NPTH (Non Plating Through Hole) formed on the stacked structure 100, which penetrates through the first signal transmission layer 140 and the first insulating layer 130 in sequence so as to be in communication with the first ground layer 120, and an inner surface of each of the insulating through holes 200 is not filled or coated with conductive metal material or electroplating material that can be electrically conducted with the first ground layer 120 and the polymer conductive members 300. In this embodiment, each of the insulating through holes 200 does not include any conductive metal material or electroplating material coated therein. In this embodiment, each of the insulating through holes 200 extends vertically into the first signal transmission layer 140 and the first insulating layer 130. In other words, an axle center (e.g., Z axis) of each of the insulating through holes 200 is perpendicular to a major axis direction of the first ground layer 120 (e.g., X-axis).

In addition, the first ground layer 120 includes at least one first film-liked metal ground layer 121. The first signal transmission layer 140 includes a plurality of lines on the first insulating layer 130. Each of the lines is, for example, a first film-liked metal signal layer 141, and the first film-liked metal signal layer 141 is interposed between the insulating through holes 200.

Furthermore, in this embodiment, a section of each of the insulating through holes 200 is in a cylinder, in other words, any two cross sections of the insulating through holes 200 are the same in diameter. The polymer conductive members 300 are respectively located within the insulating through holes 200, and a part of each of the polymer conductive members 300 is completely filled in one of the insulating through holes 200.

Each of the polymer conductive members 300 includes a first end 310 and a second end 320 which are opposite to each other. The first end 310 of the polymer conductive member 300 is in one of the insulating through holes 200, and is electrically connected to the first film-liked metal ground layer 121 of the first ground layer 120. The second end 320 of the polymer conductive member 300 is located outside the polymer conductive member 300, and the second end 320 protrudes outwards from one surface 142 of the first signal transmission layer 140 opposite to the first ground layer 120 from the insulating through hole 200. Furthermore, in this embodiment, a section of each of the polymer conductive members 300 is in a cylinder, that is, a width W of the first end 310 and a width W of the second end 320 of the polymer conductive member 300 are equal.

In addition, in this embodiment, each of the polymer conductive members 300 is a conductive rubber, however, the disclosure is not limited thereto. In other embodiments, the polymer conductive members 300 may also be conductive plastic or conductive silicone etc.

in this embodiment, each of the polymer conductive members 300 includes a polymer elastic body 331 and a plurality of conductive particles 332 distributed in the polymer elastic body 331, however, the disclosure is not limited thereto.

Figure 2:
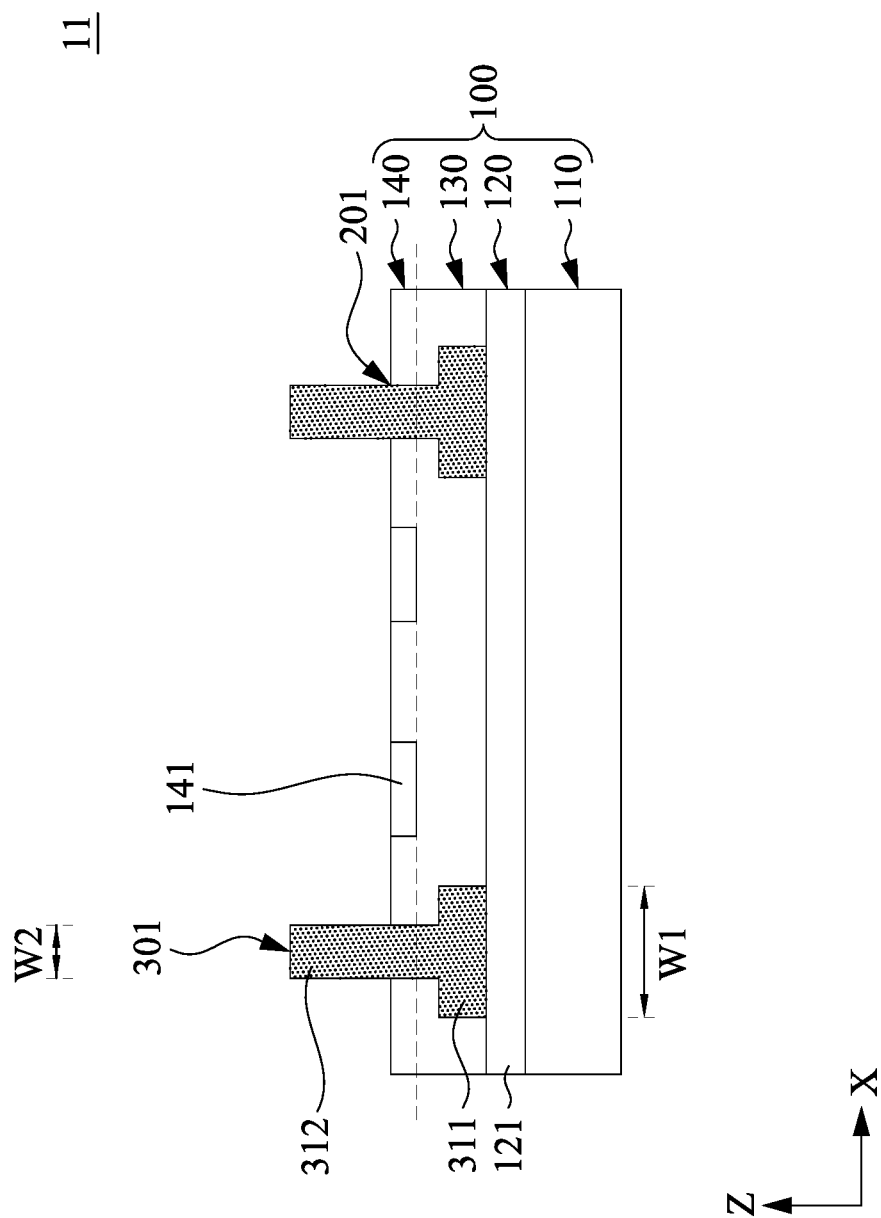
FIG. 2 is a schematic view of a circuit board according to one embodiment of the present disclosure.

FIG. 2 is a schematic view of a circuit board 11 according to one embodiment of the present disclosure. As shown in FIG. 2, the circuit board 11 of the embodiment and the circuit board 10 of FIG. 1 are substantially the same, except that the longitudinal sections of the insulating through holes 201 are not the same in size, and a section of each of the insulating through holes 201 is in a shape of a wide bottom and a narrow top, and a longitudinal section of each of the polymer conductive members 301 fully filled in the insulating through hole 201 is also in the shape of a wide bottom and a narrow top. In other words, a width W1 of the first end 311 of the polymer conductive member 301 is greater than a width W2 of the second end 312 thereof. For example, the longitudinal section of each of the polymer conductive members 301 is in an inverted T shape. The inverted T shape includes a first portion (see the part 311) transversely extending in the first insulating layer 130, and a second portion (see the part 312) extending longitudinally in the first insulating layer 130 and first signal transmission layer 140.

It is noted, since a width W1 of the first end 311 of each of the polymer conductive members 301 is greater than a width W2 of the second end 312 thereof, it is helpful for the first end 311 of the polymer conductive member 301 to be engaged within the first insulating layer 130, so that the polymer conductive members 301 are not easily separated from the stacked structure 100.

Figure 3:
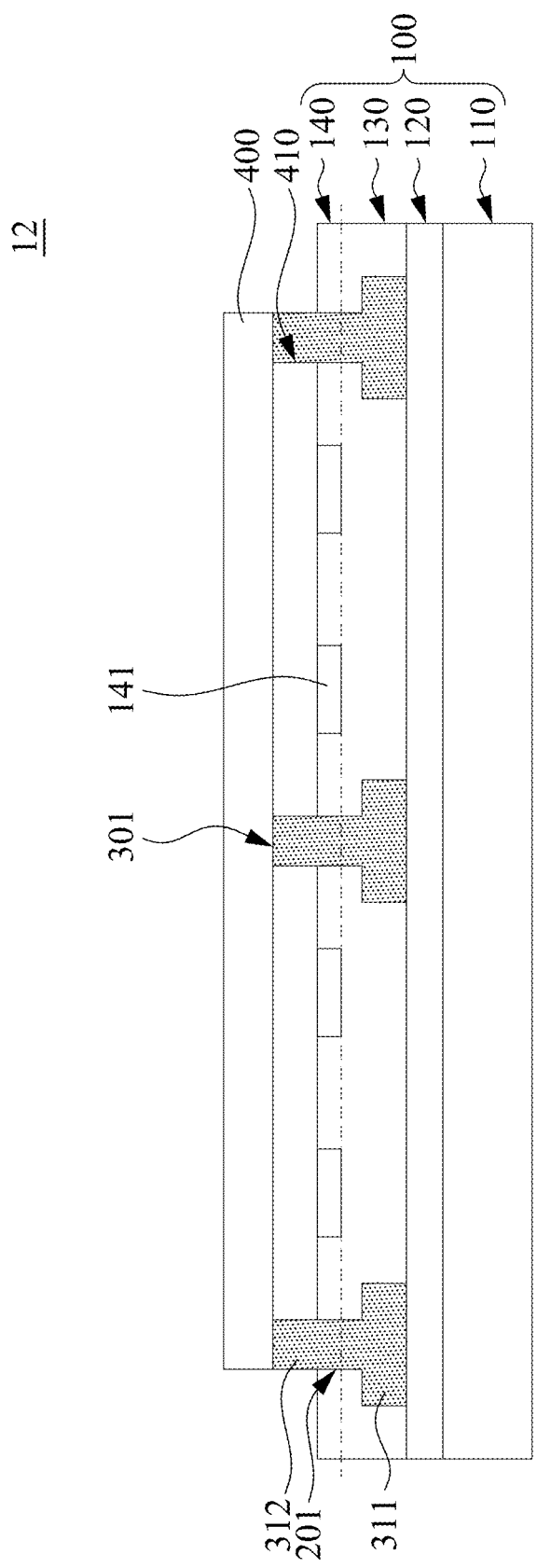
FIG. 3 is a schematic view of a circuit board according to one embodiment of the present disclosure.

FIG. 3 is a schematic view of a circuit board 12 according to one embodiment of the present disclosure. As shown in FIG. 3, the circuit board 12 of the embodiment and the circuit board 11 of FIG. 2 are substantially the same, except that the circuit board 12 further includes a first crossover portion 400. The first crossover portion 400 is disposed outside the insulating through holes 201, and the first crossover portion 400 covers the first film-liked metal signal layers 141 of the first signal transmission layer 140. The first crossover portion 400 is connected to the second ends 312 of these polymer conductive members 301 collectively, so that at least one air gap 410 is defined by the first crossover portion 400, these polymer conductive members 301 and the stacked structure 100 (e.g., first signal transmission layer 140) together. The air gap 410 is located between the first crossover portion 400 and the first signal transmission layer 140, and physically separated the first crossover portion 400 and the first signal transmission layer 140 from each other. The first crossover portion 400 and the first signal transmission layer 140 are physically separated so as to form an isolation layer therebetween, and the isolation layer which is an air channel for taking the heat away, can electrically isolate the first crossover portion 400 and the first signal transmission layer 140.

Furthermore, the first crossover portion 400 is an independent conductive element, such as a conductive sheet, a conductive plate or a conductive film whose material is different from that of the polymer conductive members 301;

or, the first crossover portion 400 at least is not integrally formed with the polymer conductive members 301. The material of the first crossover portion 400 is for example, conductive metal (e.g., copper or aluminum, etc.) or conductive non-metal (e.g., graphite or conductive rubber, etc.).

Figure 4:
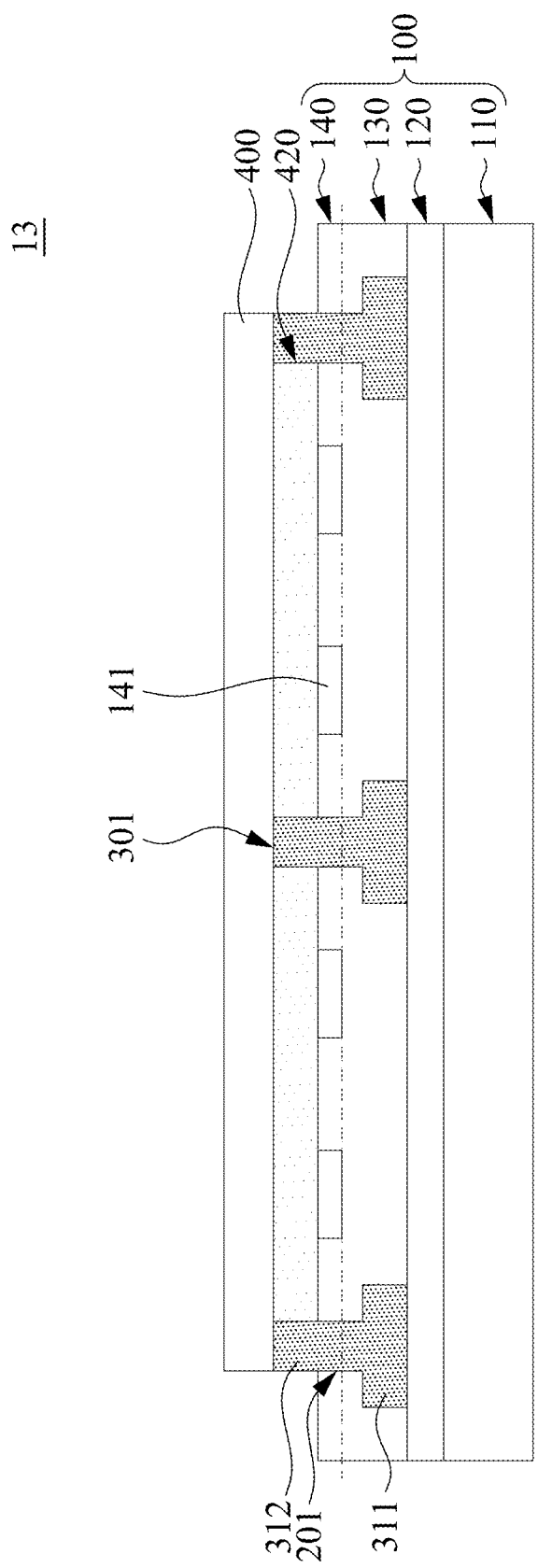
FIG. 4 is a schematic view of a circuit board according to one embodiment of the present disclosure.

FIG. 4 is a schematic view of a circuit board 13 according to one embodiment of the present disclosure. As shown in FIG. 4, the circuit board 13 of the embodiment and the circuit board 12 of FIG. 3 are substantially the same, except that the layer interposed between the first crossover portion 400 and the first signal transmission layer 140 is a first isolation layer 420 in a solid state, rather than the aforementioned air gap 410. In other words, the first isolation layer 420 interposed between the first crossover portion 400 and the first signal transmission layer 140 can support the first crossover portion 400, protect the first signal transmission layer 140 and electrically insulate the first crossover portion 400 and the first signal transmission layer 140. The first isolation layer 420 includes electrical insulation material, such as insulating paste or insulating paint.

Additionally, in the embodiment, the first isolation layer 420 is fully filled into the aforementioned air gap 410 (refer to FIG. 3) between the first crossover portion 400 and the first signal transmission layer 140 so as to be in direct contact with the surfaces of the first crossover portion 400, each of the polymer conductive members 301 and the stacked structure 100 (e.g., the first signal transmission layer 140).

Figure 5:
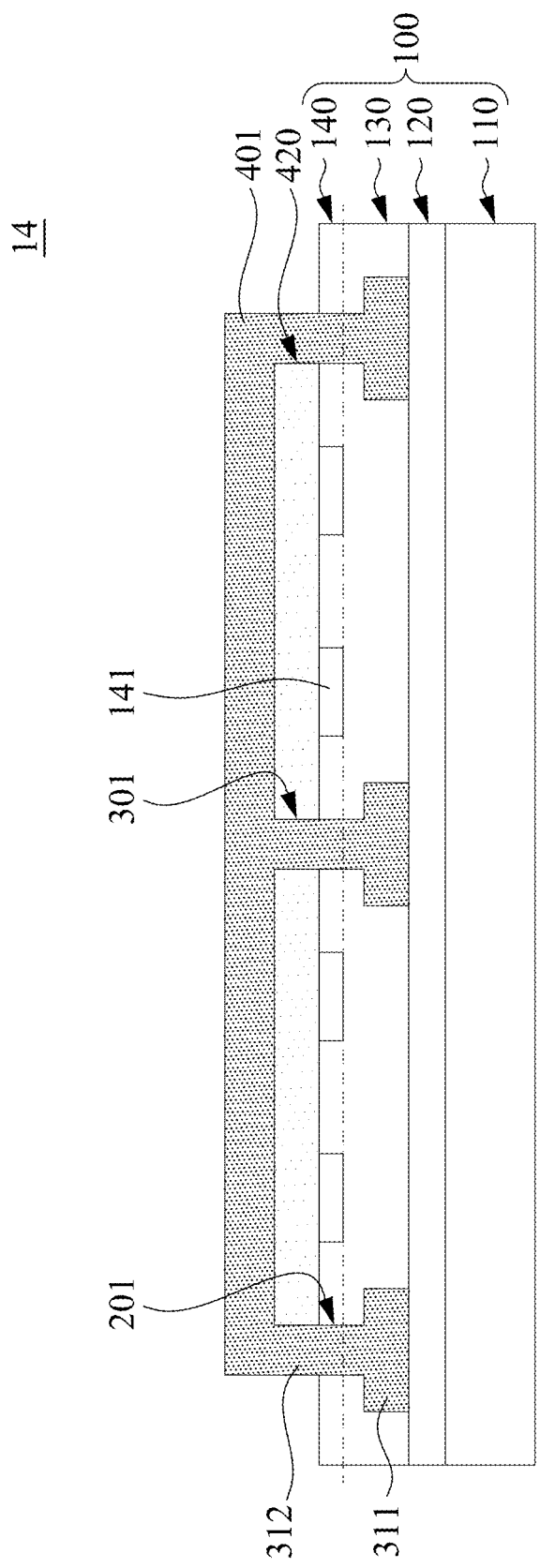
FIG. 5 is a schematic view of a circuit board according to one embodiment of the present disclosure.

FIG. 5 is a schematic view of a circuit board 14 according to one embodiment of the present disclosure. As shown in FIG. 5, the circuit board 14 of the embodiment and the circuit board 13 of FIG. 4 are substantially the same, except that the material of the first crossover portion 401 is the same as the material of the polymer conductive members 301, and the first crossover portion 401 and the polymer conductive members 301 are integrally formed together, so that the first crossover portion 401 and the polymer conductive members 301 are parts of the same object. For example, the material of the first crossover portion 401 is conductive rubber, and the layer interposed between the first crossover portion 400 and the first signal transmission layer 140 may be not limited to either a void air gap or a solid electrical insulating material.

Figure 6:
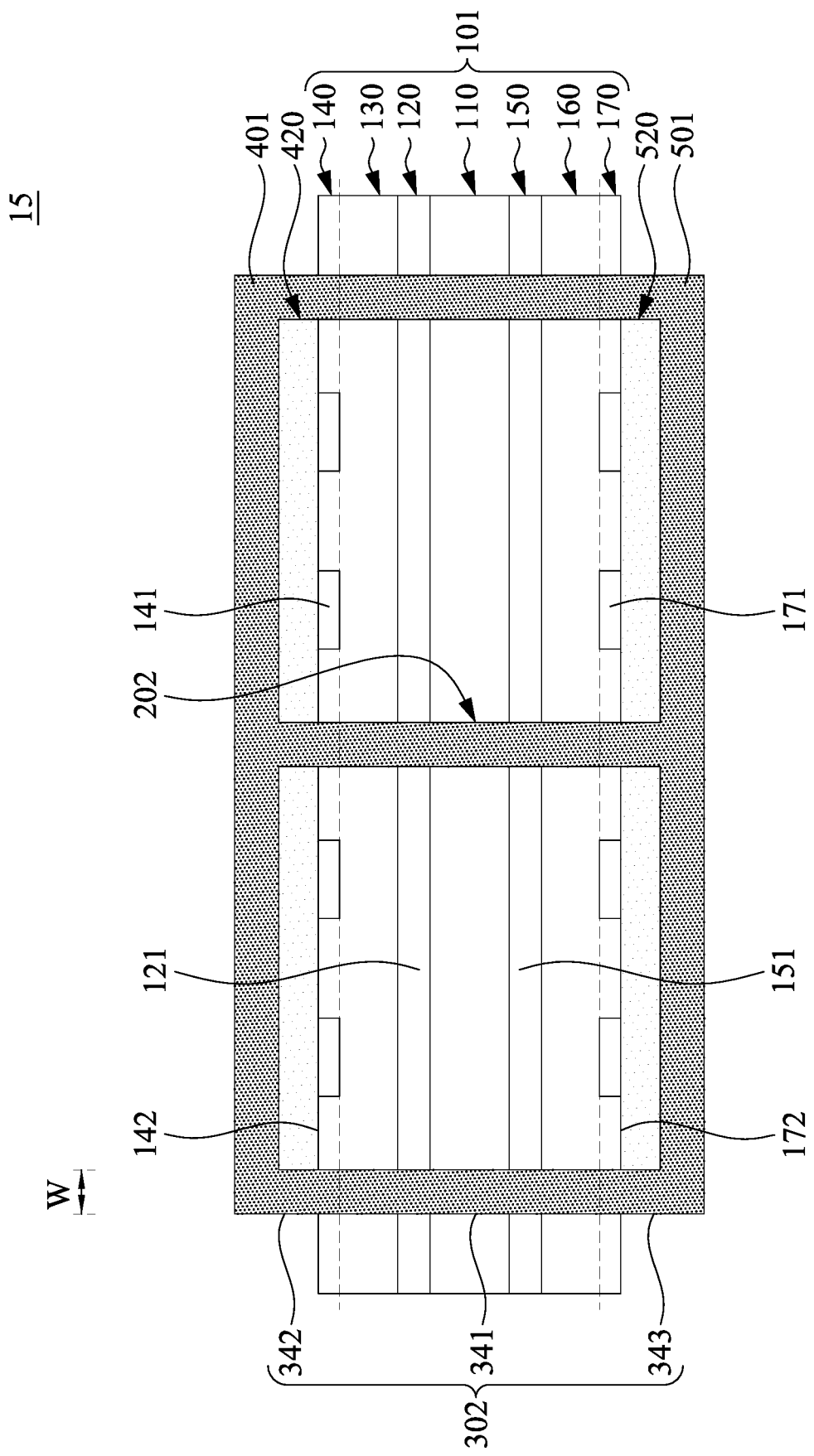
FIG. 6 is a schematic view of a circuit board according to one embodiment of the present disclosure.

FIG. 6 is a schematic view of a circuit board 15 according to one embodiment of the present disclosure. As shown in FIG. 6, the circuit board 15 of the embodiment and the circuit board 14 of FIG. 5 are substantially the same, except that, the stacked structure 101 further includes a second ground layer 150, a second insulating layer 160, and a second signal transmission layer 170. The second ground layer 150, the second insulating layer 160, and the second signal transmission layer 170 are stacked on one surface of the insulating substrate layer 110 opposite to the first ground layer 120 in sequence. More specifically, the second insulating layer 160 is disposed on one side of the insulating substrate layer 110 opposite to the first insulating layer 130. The second ground layer 150 is disposed between the second insulating layer 160 and the insulating substrate layer 110. The second signal transmission layer 170 is disposed on one side of the second insulating layer 160 opposite to the insulating substrate layer 110, however, the disclosure is not limited thereto.

In the embodiment, each of the insulating through holes 202, for example is a through hole on the stacked structure 101, and penetrates through the first signal transmission layer 140, the first insulating layer 130, the first ground layer 120, the insulating substrate layer 110, the second ground layer 150, the second insulating layer 160 and the second signal transmission layer 170 so as to conduct with the first ground layer 120 and the second ground layer 150. In this embodiment, each of the insulating through holes 202 extends vertically into the first signal transmission layer 140, the first insulating layer 130, the first ground layer 120, the insulating substrate layer 110, the second ground layer 150, the second insulating layer 160 and the second signal transmission layer 170, in other words, an axle center (e.g., Z axis) of each of the insulating through holes 202 is perpendicular to a major axis direction of the second ground layer 150 (e.g., X-axis).

In addition, the second ground layer 150 includes at least one second film-liked metal ground layer 151. The second signal transmission layer 170 includes a plurality of lines on the second insulating layer 160. Each of the lines is, for example, a second film-liked metal signal layer 171, and the second film-liked metal signal layer 171 is interposed between the insulating through holes 202.

Each of the polymer conductive members 302 includes a middle section 341, a first end section 342 and a second end section 343. The first end section 342 and the second end section 343 are opposite to each other, and the middle section 341 connects to the first end section 342 and the second end section 343. The middle section 341 is located in one of the insulating through holes 202, and electrically connected to the first film-liked metal ground layer 121 of the first ground layer 120 and the second film-liked metal ground layer 151 of the second ground layer 150. The first end section 342 is located outside the insulating through hole 202, and protrudes outwards the surface 142 of the first signal transmission layer 140 opposite to the first ground layer 120 from the insulating through hole 202. The second end section 343 is located outside the insulating through hole 202, and protrudes outwards the surface 172 of the second signal transmission layer 170 opposite to the second ground layer 150 from the insulating through hole 202.

Furthermore, in this embodiment, the middle section 341 of the polymer conductive members 302 is also in a cylinder, that is, the middle section 341 has a single width W. The first crossover portion 401 is located outside the insulating through holes 202, collectively connected to the first end sections 342 of the polymer conductive members 302, and covers the first film-liked metal signal layer 141 of the first signal transmission layer 140.

The circuit board 15 further includes a second crossover portion 501 and a second isolation layer 520. The second crossover portion 501 is located outside the insulating through holes 202, collectively connected to the second end sections 343 of the polymer conductive members 302, and covers the second film-liked metal signal layer 171 of the second signal transmission layer 170. The second isolation layer 520 is interposed between the second crossover portion 501 and the second signal transmission layer 170, and the second isolation layer 520 can support the second crossover portion 501 and electrically insulate the second crossover portion 501 and the second signal transmission layer 170. The second isolation layer 520, for example includes electrical insulation material. In the embodiment, the second isolation layer 520 is fully filled between the second crossover portion 501 and the second signal transmission layer 170 so as to be in direct contact with the surfaces of the second crossover portion 501, each of the polymer conductive members 302 and the stacked structure 100 (e.g., the second signal transmission layer 170).

The materials of the first crossover portion 401 and the second crossover portion 501 are the same as the materials of the polymer conductive members 302, and the first crossover portion 401, the second crossover portion 501 and the polymer conductive members 302 are integrally formed together so that the first crossover portion 401, the second crossover portion 501 and the polymer conductive members 302 are parts of the same object.

Figure 7A:
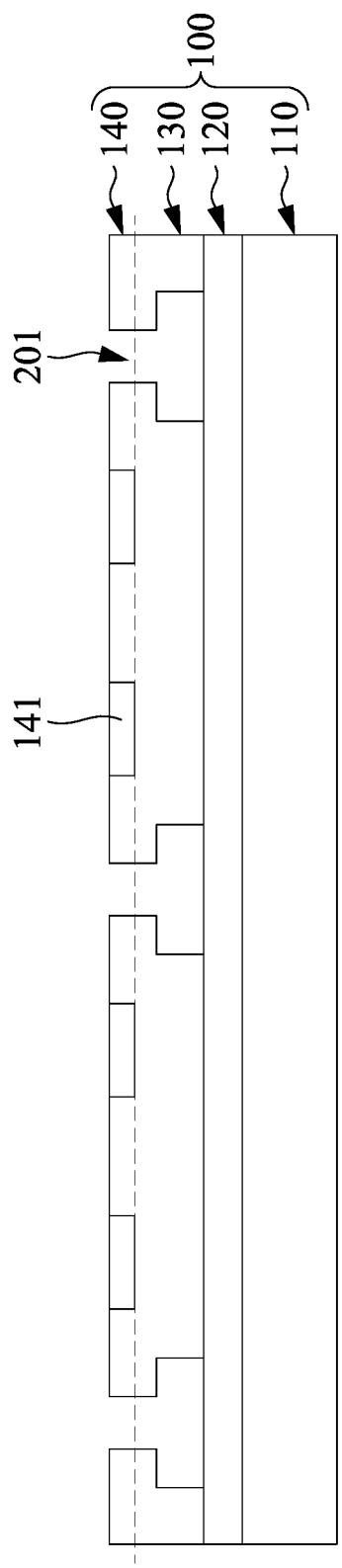
FIG. 7A to FIG. 7E are continual schematic diagrams of manufacturing the circuit board of FIG. 5.
Figure 7B:
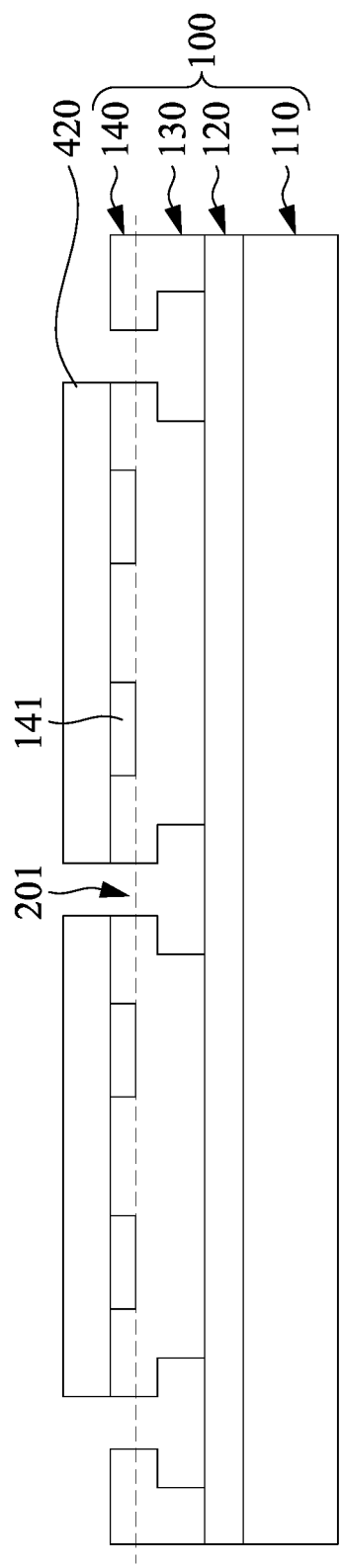
Figure 7C:
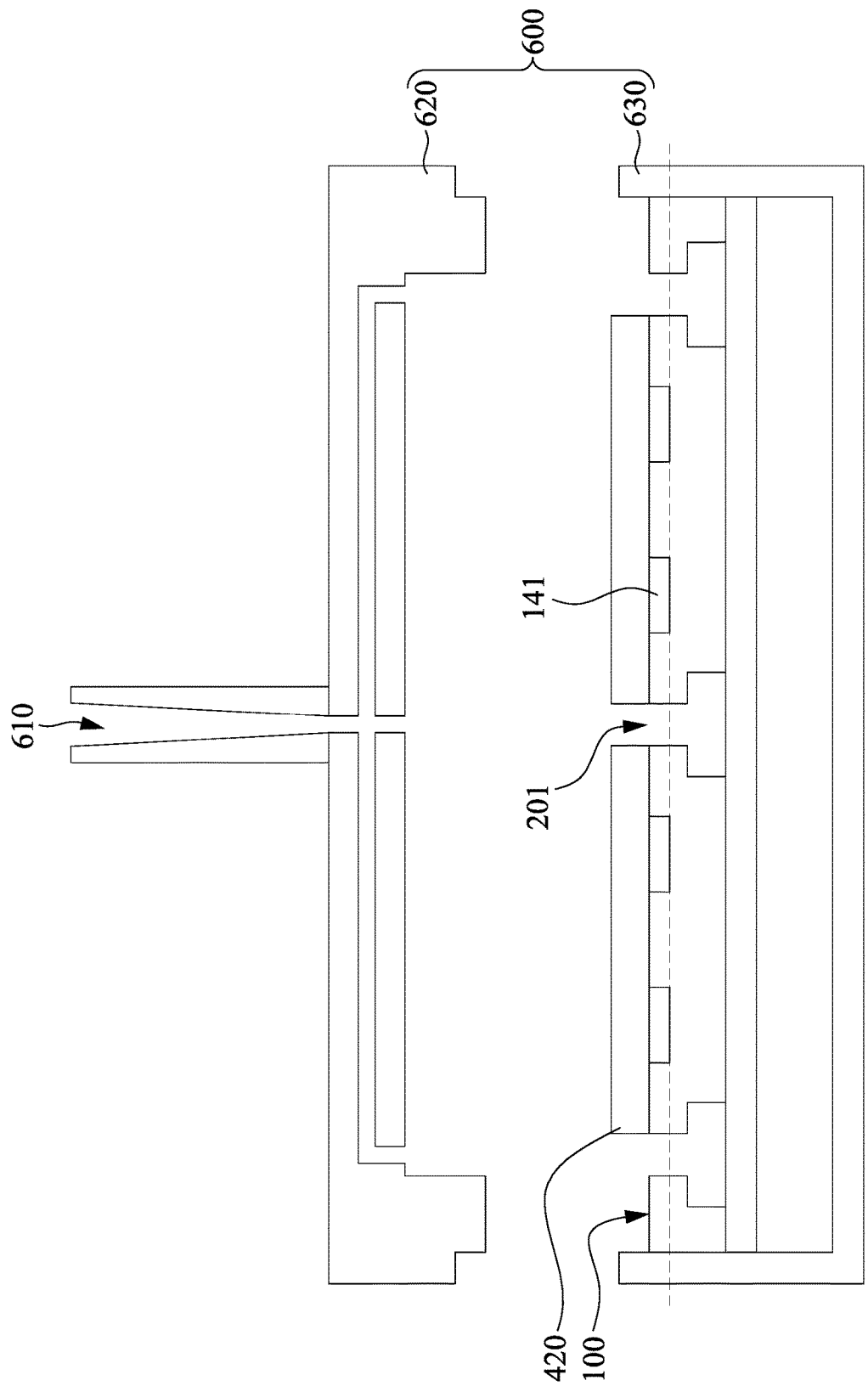
Figure 7D:
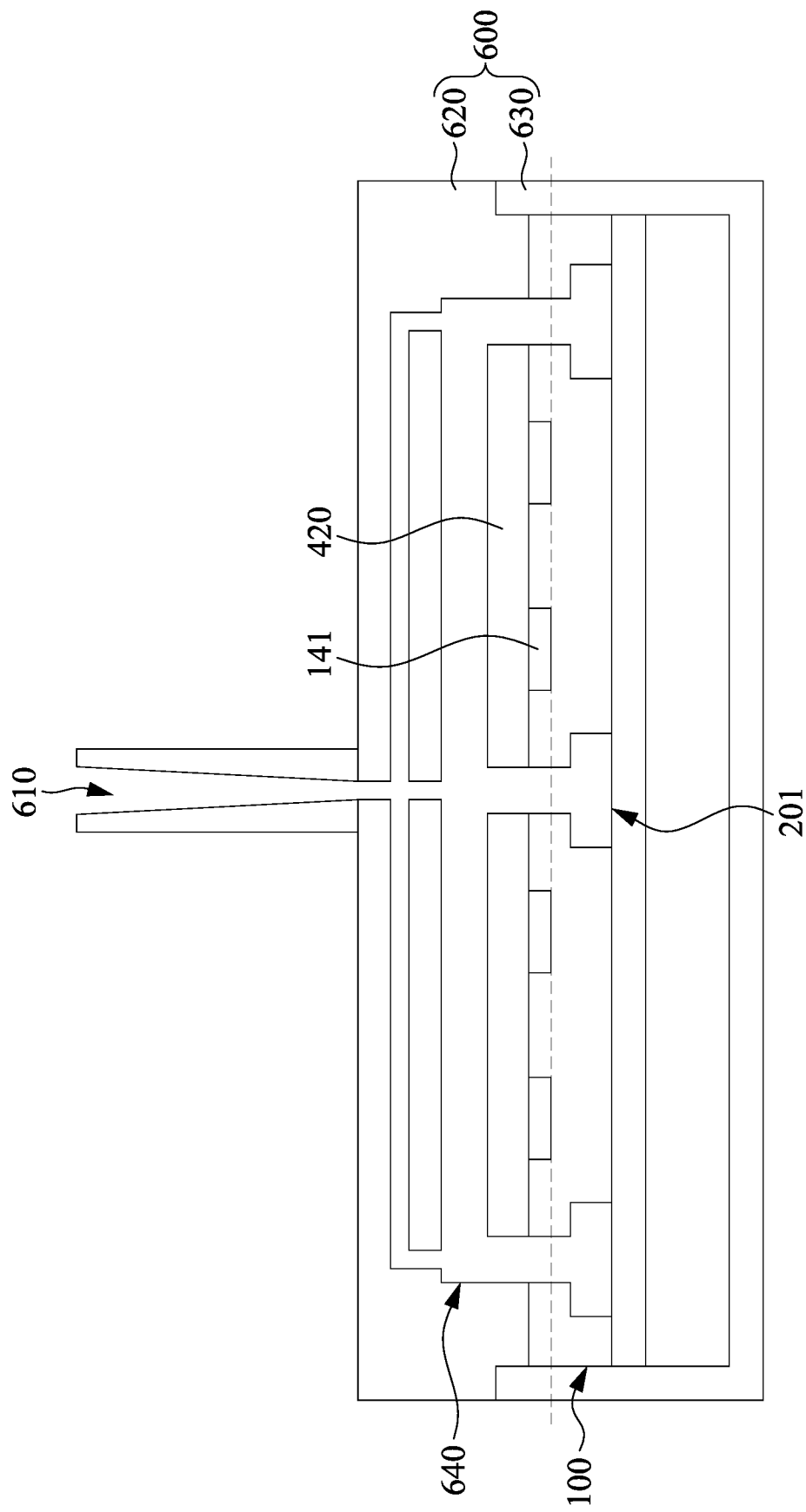
Figure 7E:
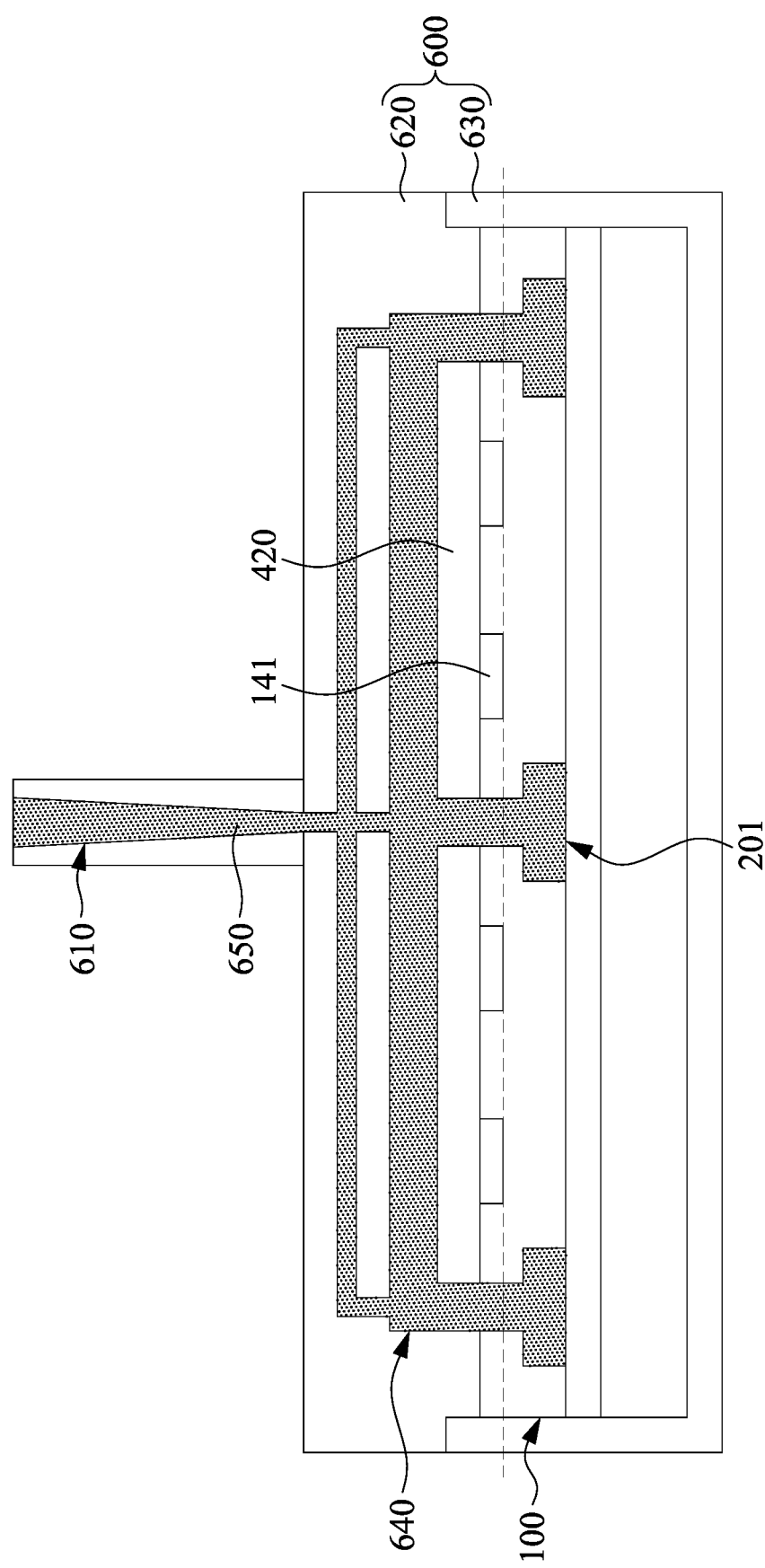

FIG. 7A to FIG. 7E are continual schematic diagrams of manufacturing the circuit board of FIG. 5. A manufacturing personnel performs steps described below in sequence according to a manufacturing process of circuit boards. First, as shown in FIG. 7A, a stacked structure 100 is obtained, wherein a surface of the stacked structure 100 is already formed with the above-mentioned insulating through holes 201 in a shape of a wide bottom and a narrow top, and the above-mentioned the first film-liked metal signal layer 141 has been formed on the surface of the stacked structure 100, however, the disclosure is not limited thereto. Next, as shown in FIG. 7B, the above-mentioned first isolation layer 420 is formed on the surface of the stacked structure 100 to and directly covers the above-mentioned first film-liked metal signal layer 141 and the stacked structure 100 (e.g., the first signal transmission layer 140). Next, as shown in FIG. 7C and FIG. 7D, the stacked structure 100 with the above-mentioned first isolation layer 420 is put between an upper mold block 620 and a lower mold block 630 of a mold 600 of an in-mold injection molding equipment (FIG. 7C), and then, the upper mold block 620 and the lower mold block 630 are shut to each other (FIG. 7D). Next, as shown in FIG. 7E, a molten material is injected into a forming cavity 640 in the mold 600 through a feeding inlet 610 of the mold 600, so that an injected molten material 650 fully fills into the forming cavity 640 and the insulating through holes 201 of the stacked structure 100. After the mold is cooled and the demolding step is completed, the manufacturing personnel can separate the circuit board 14 from the mold 600 to obtain the circuit board 14 as shown in FIG. 5, and after the injected molten material 650 is cooled, the above-mentioned polymer conductive members can be formed on the stacked structure 100.

It is noted, the disclosure is not limited to making the polymer conductive members through the above-mentioned in-mold injection molding equipment only, and the above manufacturing process is only for illustration. In addition, in other embodiments, after the polymer conductive members are inserted into the insulating through holes, the polymer conductive members may be fused to connect the polymer conductive members and the ground layer through a high temperature device. In addition, the insulating through holes is not limited to be formed by drilling or etching, and the insulating through holes may also be formed as openings on different layers of the stacked structure.

Thus, through the construction of the embodiments above, the conductive hole (i.e., VIA) process of the conventional circuit board is replaced by filling the polymer conductive members into the circuit board and conducting the ground layer in the circuit board. In this way, not only the manufacturing process is simplified, the operation time is shortened, but also the manufacturing cost and material cost are saved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A circuit board, comprising:
   a first insulating layer;
   an insulating substrate layer;
   a first ground layer disposed between the first insulating layer and the insulating substrate layer, and the first ground layer comprising at least one first film-liked metal ground layer;
   a first signal transmission layer disposed at one side of the first insulating layer opposite to the insulating substrate layer, and the first signal transmission layer comprising a plurality of first film-liked metal signal layers;
   a plurality of insulating through holes, each of the insulating through holes penetrating through the first signal transmission layer and the first insulation layer to connect to the first ground layer; and
   a plurality of polymer conductive members respectively disposed within the insulating through holes,
   wherein a first portion of each of the polymer conductive members is electrically connected to the at least one first film-liked metal ground layer, and a second portion of each of the polymer conductive members protrudes outwards from a surface of the first signal transmission layer.

2. The circuit board of claim 1, wherein each of the polymer conductive members is formed by injecting molten material into the insulating through holes through an in-mold injection molding equipment,
   wherein, no electroplating material or metal material, which is in communication with the first ground layer and the first signal transmission layer, is provided within each of the insulating through holes.

3. The circuit board of claim 1, wherein each of the polymer conductive members is a cylinder.

4. The circuit board of claim 1, wherein at least one of the insulating through holes is in a shape of a wide bottom and a narrow top.

5. The circuit board of claim 1, further comprising:
   a first crossover portion disposed outside the insulating through holes, and electrically connected to the polymer conductive members collectively, and covering the first film-liked metal signal layers.

6. The circuit board of claim 5, wherein the first crossover portion is integrally formed with the polymer conductive members.

7. The circuit board of claim 5, wherein the first crossover portion is an independent conductive element, and electrically connected to the polymer conductive members.

8. The circuit board of claim 5, further comprising:
   an isolation layer located between the first crossover portion and the first film-liked metal signal layers, wherein the isolation layer is an air gap or an electrical insulation material.

9. The circuit board of claim 1, further comprising:
   a second insulating layer disposed at one side of the insulating substrate layer opposite to the first insulating layer;
   a second ground layer disposed between the second insulating layer and the insulating substrate layer, and the second ground layer comprising at least one second film-liked metal ground layer; and
   a second signal transmission layer disposed at one side of the second insulating layer opposite to the insulating substrate layer, and the second signal transmission layer comprising a plurality of second film-liked metal signal layers, wherein each of the insulating through holes further penetrates through the first ground layer, the insulating substrate layer, the second ground layer, the second insulating layer and the second signal transmission layer, and connected to the second ground layer, the polymer conductive members are respectively disposed within the insulating through holes, wherein a third portion of each of the polymer conductive members is electrically connected to the second signal transmission layer, and a fourth portion of each of the polymer conductive members protrudes outwards from a surface of the second signal transmission layer.

10. The circuit board of claim 9, further comprising:
a second crossover portion disposed outside the insulating through holes, and electrically connected to the fourth portions of the polymer conductive members, and covering the second film-liked metal signal layers.

11. The circuit board of claim 1, wherein each of the polymer conductive members comprises a polymer elastic body and a plurality of conductive particles distributed in the polymer elastic body.

12. A circuit board, comprising:
a first insulating layer;
an insulating substrate layer;
a first ground layer disposed between the first insulating layer and the insulating substrate layer, and the first ground layer comprising at least one first film-liked metal ground layer;
a first signal transmission layer disposed at one side of the first insulating layer opposite to the insulating substrate layer, and the first signal transmission layer comprising a plurality of first film-liked metal signal layers;
a plurality of insulating through holes, each of the insulating through holes penetrating through the first signal transmission layer and the first insulation layer to connect to the first ground layer; and
a plurality of polymer conductive members respectively disposed within the insulating through holes, each of the polymer conductive members comprises a first portion and a second portion which are perpendicularly connected to each other,
wherein the first portion transversely extends in the first insulating layer, and is electrically connected to the at least one first film-liked metal ground layer, and the second portion extends longitudinally through the first insulating layer and the first signal transmission layer.

13. The circuit board of claim 12, wherein a longitudinal section of each of the polymer conductive members is in an inverted T shape.

14. The circuit board of claim 12, wherein each of the polymer conductive members is formed by injecting molten material into the insulating through holes through an in-mold injection molding equipment,
wherein, no electroplating material or metal material, which is in communication with the first ground layer and the first signal transmission layer, is provided within each of the insulating through holes.

15. The circuit board of claim 12, wherein at least one of the insulating through holes is in a shape of a wide bottom and a narrow top.

16. The circuit board of claim 12, wherein each of the polymer conductive members comprises a polymer elastic body and a plurality of conductive particles distributed in the polymer elastic body.

17. The circuit board of claim 12, further comprising:
a first crossover portion disposed outside the insulating through holes, and electrically connected to the polymer conductive members collectively, and covering the first film-liked metal signal layers.

18. The circuit board of claim 17, wherein the first crossover portion is integrally formed with the polymer conductive members.

19. The circuit board of claim 17, wherein the first crossover portion is an independent conductive element, and electrically connected to the polymer conductive members.

20. The circuit board of claim 17, further comprising:
an isolation layer located between the first crossover portion and the first film-liked metal signal layers, wherein the isolation layer is an air gap or an electrical insulation material.

* * * * *